United States Patent
Kim

(10) Patent No.: US 9,640,708 B2
(45) Date of Patent: May 2, 2017

(54) PASTE AND MANUFACTURING METHOD OF SOLAR CELL USING THE SAME

(71) Applicant: LG CHEM, LTD., Seoul (KR)

(72) Inventor: Min-Seo Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 168 days.

(21) Appl. No.: 14/340,140

(22) Filed: Jul. 24, 2014

(65) Prior Publication Data

US 2014/0335647 A1 Nov. 13, 2014

Related U.S. Application Data

(62) Division of application No. 13/062,114, filed as application No. PCT/KR2009/005058 on Sep. 7, 2009, now abandoned.

(30) Foreign Application Priority Data

Sep. 5, 2008 (KR) .................. 10-2008-0087712
Sep. 7, 2009 (KR) .................. 10-2009-0084172

(51) Int. Cl.
 *H01L 31/18* (2006.01)
 *H01L 31/0224* (2006.01)

(52) U.S. Cl.
 CPC .. *H01L 31/1804* (2013.01); *H01L 31/022425* (2013.01); *Y02E 10/50* (2013.01)

(58) Field of Classification Search
 None
 See application file for complete search history.

(56) References Cited

U.S. PATENT DOCUMENTS

| | | | |
|---|---|---|---|
| RE37,512 E * | 1/2002 | Szlufcik | H01L 31/02242 136/256 |
| 7,413,799 B2 | 8/2008 | Hiruma et al. | |
| 2005/0126627 A1* | 6/2005 | Hayashida | H01L 31/02363 136/257 |
| 2007/0269923 A1 | 11/2007 | Lee et al. | |
| 2008/0200036 A1 | 8/2008 | Stockum et al. | |
| 2009/0014062 A1* | 1/2009 | Kayama | H01G 9/2031 136/256 |

FOREIGN PATENT DOCUMENTS

| JP | 06-001605 | 1/1994 |
|---|---|---|
| JP | 2002-025341 A | 1/2002 |

\* cited by examiner

*Primary Examiner* — Alexander Ghyka
(74) *Attorney, Agent, or Firm* — Dentons US LLP

(57) ABSTRACT

Disclosed are a paste and a method for manufacturing a solar cell through screen printing said paste. The paste contains inorganic powder; an organic solvent; and a binder, and the inorganic powder has a tap density of 0.01 to 20 g/cm$^3$. An etching mask pattern formed using said paste has good etch resistance in an etch-back process by which a selective emitter is formed, and thus, a stable emitter can be formed.

13 Claims, 5 Drawing Sheets

PASTE AND MANUFACTURING METHOD OF SOLAR CELL USING THE SAME

This application is a Divisional of U.S. Ser. No. 13/062,114, filed on Mar. 3, 2011, which is National Stage application of PCT/KR2009/005058, filed on Sep. 7, 2009, which claims priority to Korean Patent Application Nos. 10-2008-0087712, filed on Sep. 5, 2008, and 10-2009-0084172, filed on Sep. 7, 2009, all of which are hereby incorporated by reference in their entirety.

BACKGROUND OF THE INVENTION

Field of the Invention

The present invention relates to a paste and a method for manufacturing a solar cell using the same, and in particular, to a paste for forming an etching mask pattern, which is capable of forming a selective emitter layer more stably, and a method for manufacturing a solar cell using the same.

Description of the Related Art

Recently, it is expected that conventional energy sources such as oil or charcoal will be exhausted, and thus interests in alternative energy are increasing. Among alternative energy, a solar cell has abundant energy sources and does not cause environmental pollution, and thus it becomes the object of attention.

The solar cell is classified into a solar heat cell that produces vapor required to run a turbine using solar heat, and a solar light cell that converts photons into electrical energy using properties of a semiconductor. Generally, the solar light cell is represented as a solar cell.

The solar cell largely includes a silicon solar cell, a compound semiconductor solar cell and a tandem solar cell according to raw material. Among them, the silicon solar cell leads the solar cell market.

FIG. 1 is a cross-sectional view illustrating a basic structure of a silicon solar cell. Referring to FIG. 1, the silicon solar cell includes a substrate 101 of a p-type silicon semiconductor, and an emitter layer 102 of an n-type silicon semiconductor. A p-n junction is formed at an interface between the substrate 101 and the emitter layer 102 in the similar way to a diode.

When light falls on a solar cell of the above-mentioned structure, electrons and electron holes create in a silicon semiconductor doped with an impurity by the photovoltaic effect. Specifically, electrons create in the emitter layer 102 of an n-type silicon semiconductor as a plurality of carriers, and electron holes create in the substrate 101 of a p-type silicon semiconductor as a plurality of carriers. The electrons and electron holes created by the photovoltaic effect are drawn toward the n-type silicon semiconductor and p-type silicon semiconductor, and move to a front electrode 103 on the emitter layer 102 and a rear electrode 104 below the substrate 101, respectively. Then, when the front electrode 103 and the rear electrode 104 are connected to each other, electrical current flows.

The output characteristics of the solar cell are evaluated using an output current-voltage curve of the solar cell. On the output current-voltage curve, a point where a value Ip×Vp obtained by multiplying an output current Ip by an output voltage Vp is maximum, is defined as a maximum output Pm, and a value obtained by dividing the maximum output Pm by the total light energy incident on the solar cell (S×I: S is the area of device, I is the intensity of light irradiated on a solar cell) is defined as a conversion efficiency $\eta$. To improve the conversion efficiency $\eta$, it needs to increase a short-circuit current Isc (an output current when V=0 on the output current-voltage curve) or an open-circuit voltage Voc (an output voltage when I=0 on the output current-voltage curve) or to increase a fill factor that measures the squareness of the output current-voltage curve. As the fill factor approaches 1, the output current-voltage curve gets close to an ideal squareness and the conversion efficiency $\eta$ increases.

Among the above-mentioned three factors for determining the conversion efficiency of the solar cell, an open-circuit voltage behavior is closely related with a doping concentration of an n-type impurity when an emitter layer is formed by diffusing the n-type impurity into the surface of a substrate of a p-type silicon semiconductor. For reference, a doping profile of the n-type impurity shows that a doping concentration is highest at the surface of an emitter layer and decreases toward the substrate according to a Gaussian distribution or an Error function.

Conventionally, there is a tendency to excessively dope an emitter layer with an impurity to increase an open-circuit voltage of a solar cell. In this case, an uppermost portion (hereinafter referred to as a dead layer) of the emitter layer has higher doping concentration of an n-type impurity than the solubility of a solid in a silicon semiconductor. For reference, the dead layer has a thickness of about 50 to 200 nm. As a result, mobility of carriers decreases near the surface of the emitter layer, a recombination rate of the carriers increases by influence of scattering of excess impurities, and life of the carriers reduces.

To solve the problems, an emitter etch-back process has been suggested. The emitter etch-back process is performed after an emitter layer is formed through a diffusion process under the conditions of excessive doping with an impurity, and removes a dead layer affecting adversely the performance of a solar cell by wet etching using a mixture of nitric acid and hydrofluoric acid or $CF_4$ plasma etching.

However, the mixture of nitric acid and hydrofluoric acid or $CF_4$ plasma has disadvantages of poor etching selectivity and high etching rate for an area doped excessively with an n-type impurity. Thus, the conventional emitter etch-back process has low process reproducibility and stability in selectively removing only a portion of an emitter layer doped excessively with an n-type impurity.

Under this situation, to ensure process reproducibility and stability of the emitter etch-back process, conventionally overetching was performed, that is, even a portion of an area doped suitably with an n-type impurity was etched, as well as on an area doped excessively with an n-type impurity. However, if an emitter layer is overetched, there is a deterioration in contact characteristics of a front electrode connected with the emitter layer due to a low impurity concentration of the surface of the emitter layer. As a result, contact resistance between the front electrode and the emitter layer increases, and accordingly, the fill factor of a solar cell decreases. And, the decrease in fill factor of a solar cell causes reduction in conversion efficiency of the solar cell.

Meanwhile, a selective emitter process has been introduced to overcome the drawbacks of the emitter etch-back process. The selective emitter process is performed after the emitter etch-back process, and forms a mask pattern exposing only an area where a front electrode is to be formed, and diffuses an n-type impurity into a portion of the emitter layer exposed through the mask pattern, so that an emitter layer doped with a high concentration of n-type impurity is formed only at an area where a front electrode is to be formed. However, the selective emitter process needs photolithography and an additional impurity diffusion process to form a mask pattern, and accordingly, it has drawbacks of complicated manufacturing process and increased manufacturing cost of a solar cell.

SUMMARY OF THE INVENTION

The present invention is designed to solve the problems of the prior art, and therefore it is an object of the present invention to provide a method for manufacturing a solar cell that can increase reliability and simplification of a process for forming a selective emitter layer so as to improve the efficiency of a solar cell and reduce manufacturing cost of the solar cell.

To achieve the object, a paste for forming an etching mask pattern according to the present invention comprises inorganic powder; an organic solvent; and a binder, and the inorganic powder has a tap density of 0.01 to 20 $g/cm^3$.

The paste for forming an etching mask pattern according to the present invention has uniform particle shape, and the uniform particle shape is indicated as a certain tap density value of the inorganic powder. The inorganic powder of uniform particle shape has a relatively low porosity between particles, and thus, an etching mask pattern formed using the paste of the present invention has the improved resistance against an etchant to help stable formation of an emitter.

The inorganic powder of the present invention may include metal or metal oxide powder, or mixtures thereof.

And, the metal or metal oxide powder according to the present invention may be glass frit-type powder, non-glass frit-type powder, or mixtures thereof. In the present invention, "glass frit-type" metal or metal oxide powder is obtained by melting, cooling and pulverizing metal or metal oxide or mixtures thereof, and "non-glass frit-type" metal or metal oxide powder is metal or metal oxide powder itself without the above-mentioned glass frit making process.

In the paste of the present invention, the inorganic powder may include any one metal or metal oxide powder selected from the group consisting of Si, Ti, ITO, $SiO_2$, $TiO_2$, $Bi_2O_3$ and PbO, or mixtures thereof, and has an average particle diameter of 1 nm to 10 μm, preferably, 10 nm to 5 μm. Optionally, the inorganic powder may be coated with an organic compound such as silane compound, silicon oil or fatty acid.

In addition, to achieve the object, a method for manufacturing a solar cell according to the present invention comprises (a) preparing a silicon semiconductor substrate doped with a first conductive impurity; (b) forming an emitter layer on the substrate by doping an upper portion of the substrate with a second conductive impurity having the opposite polarity to the first conductive impurity; (c) forming an etching mask pattern at a front electrode connection area on the emitter layer using a paste comprising inorganic powder having a tap density of 0.01 to 20 $g/cm^3$, an organic solvent and a binder; (d) etching back the emitter layer by using the etching mask pattern as a mask; (e) removing the etching mask pattern remaining after the etch-back; (f) forming an anti-reflection film over a front surface of the substrate; (g) establishing a connection between a front electrode and the front electrode connection area by penetrating through the anti-reflection film; and (h) establishing a connection between a rear electrode and a rear surface of the substrate.

Preferably, in the method for manufacturing a solar cell according to the present invention, the paste of the present invention may be used in forming a selective emitter by screen printing.

In the manufacturing method, the first conductive impurity is a p-type impurity and the second conductive impurity is an n-type impurity.

Preferably, the step (d) etches back the emitter layer using a selective wet etchant in which $HNO_3$, HF, $CH_3COOH$ and $H_2O$ are mixed at a volume ratio of 10:0.1~0.01:1~3:5~10. At this time, the selective wet etchant has an etching rate of 0.08 to 0.12 μm/sec for an area doped with a high density of impurity in the emitter layer and an etching rate of 0.01 to 0.03 μm/sec for an area doped with a low density of impurity in the emitter layer.

Alternatively, the step (d) may etch back the emitter layer using an alkaline wet etchant such as KOH or a dry etchant such as $CF_4$ plasma.

Effects of the Invention

According to the present invention, high-temperature impurity doping is performed just once dissimilarly from a conventional emitter layer forming process, and accordingly, it can prevent activation of an impurity in a substrate.

And, the use of screen printing in forming an etching mask pattern leads to simpler manufacturing process and lower manufacturing cost than conventional photolithography.

And, it eliminates the need for vacuum deposition equipment or a high temperature furnace.

And, the resulting etching mask pattern is not easily detached during an etch-back process, thereby stably forming an emitter. Further, the use of a selective wet etchant in the etch-back process ensures stability and reproducibility of the etch-back process.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

FIGS. 2 to 7 are cross-sectional views sequentially illustrating a method for manufacturing a silicon solar cell through screen printing according to a preferred embodiment of the present invention.

Figure 1:
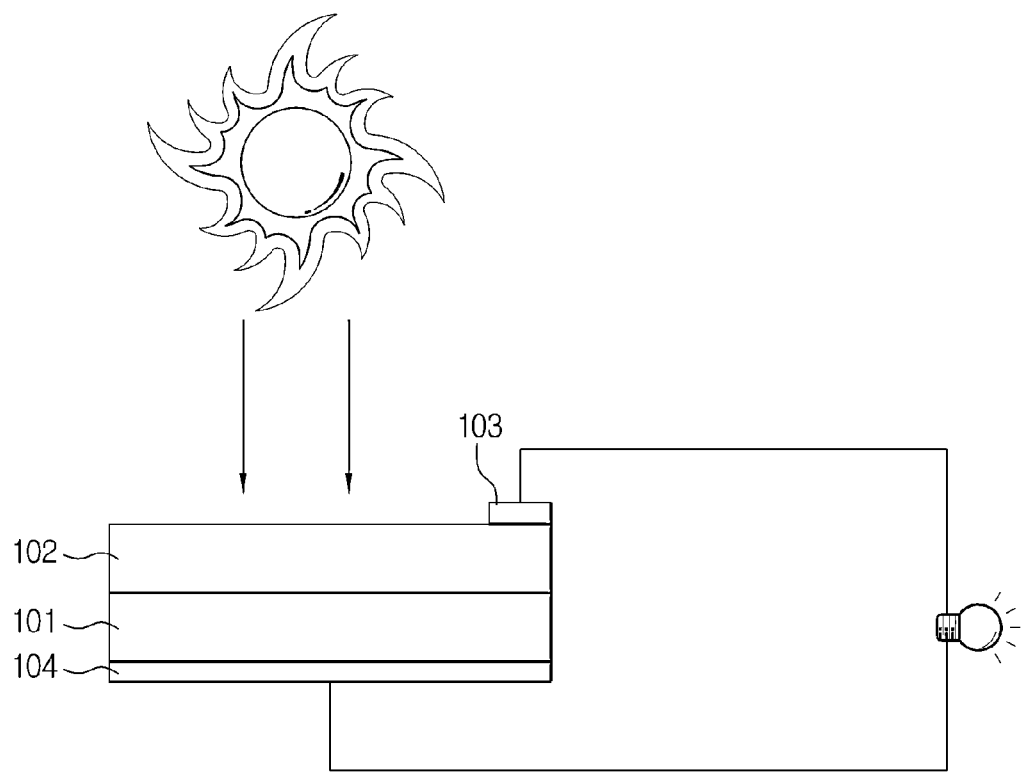
FIG. 1 is a cross-sectional view illustrating a basic structure of a silicon solar cell.
Figure 2:
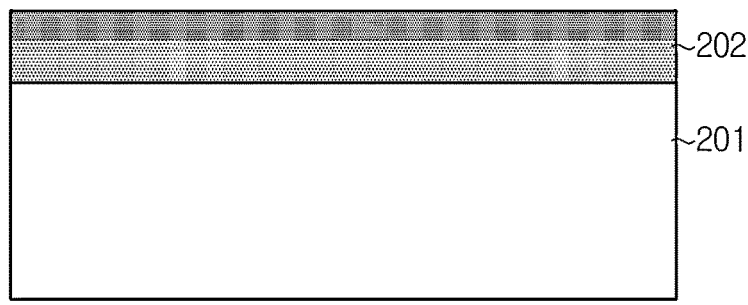
FIGS. 2 to 7 are cross-sectional views sequentially illustrating a method for manufacturing a silicon solar cell through screen printing according to a preferred embodiment of the present invention.

Referring to FIG. 2, firstly, a substrate 201 is prepared and loaded into a diffusion furnace. Here, the substrate 201 is made from a silicon semiconductor and doped with a first conductive impurity. The substrate 201 is a monocrystal, polycrystal or amorphous silicon semiconductor, and doped with a p-type impurity of group 13 elements in the periodic table, such as B, Ga, In and so on. Next, an n-type impurity source of group 15 elements in the periodic table, such as P, As, Sb and so on, is injected into the diffusion furnace together with an oxygen gas to carry out a thermal oxidation reaction, so that an oxidation film containing an n-type impurity is formed on a front surface of the substrate 201 at a predetermined thickness. Then, the n-type impurity contained in the oxidation film is driven in an upper portion of the substrate 201 by increasing the temperature of the diffusion furnace up to 800 to 900° C. At this time, a diffusion time is 30 to 60 minutes so that a sufficient amount of the n-type impurity can be diffused into the substrate 201. When the n-type impurity contained in the oxidation film is diffused into the substrate 201 through the surface, an emitter layer 202 of an n-type silicon semiconductor is formed on the substrate 201 at a predetermined thickness.

The concentration of the n-type impurity implanted into the emitter layer 202 through the above-mentioned n-type impurity diffusion process is highest at the surface of the emitter layer 202 and decreases toward the substrate 201 according to a Gaussian distribution or an Error function. And, the process conditions are controlled such that a sufficient amount of n-type impurity is diffused during the diffusion process, and accordingly, a dead layer doped with an n-type impurity at higher concentration than solid solubility exists at an uppermost portion of the emitter layer 202.

Figure 8:
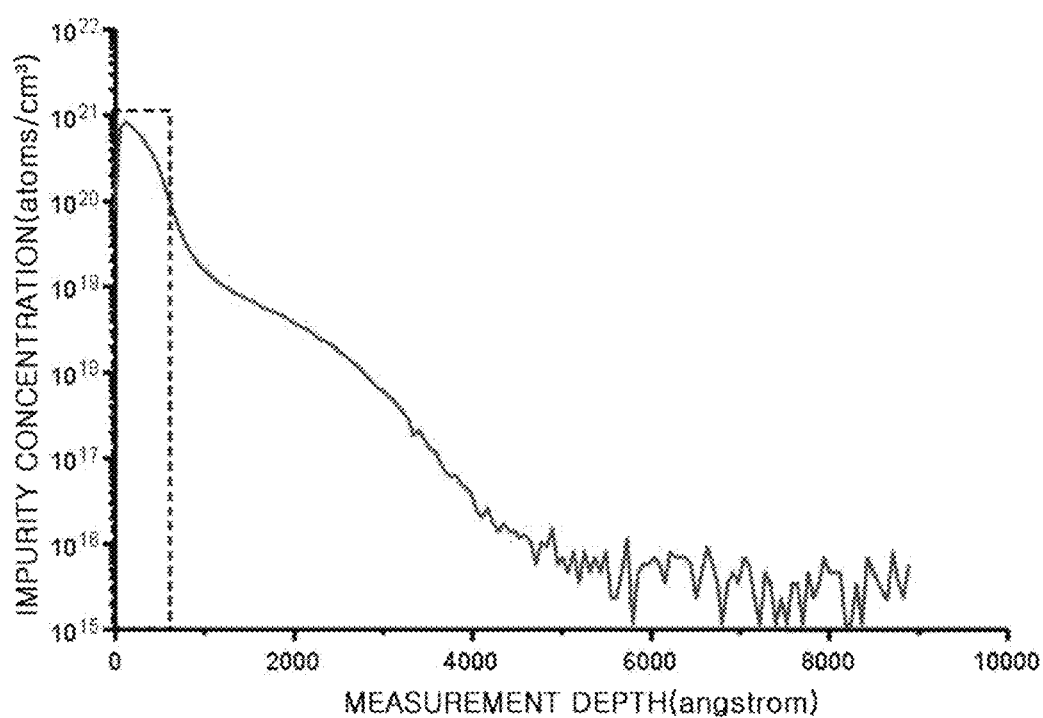
FIG. 8 is a graph illustrating a change in concentration of an n-type impurity from the surface of an emitter layer toward a substrate after an n-type impurity diffusion is completed.

FIG. 8 is a graph illustrating a change in concentration of an n-type impurity from the surface of the emitter layer 202 toward the substrate 201 after an n-type impurity diffusion is completed. In the graph, a horizontal axis is the depth of a point where the concentration of an n-type impurity is measured, relative to the surface of the emitter layer 202, and a vertical axis is the concentration of an n-type impurity at a measurement point.

Referring to FIG. 8, the concentration of an n-type impurity is highest near the surface of the emitter layer 202 and decreases inward the substrate 201. In particular, a dead layer doped with an n-type impurity at higher concentration than solubility of a solid in a silicon semiconductor exists near the surface of the emitter layer 202 (as indicated as a dotted box). The concentration of the n-type impurity contained in the dead layer depends on the kind of n-type impurity. For example, in the case that the n-type impurity is phosphorus (P), its concentration is $10^{20}$ atom/$cm^3$ or above.

Meanwhile, the emitter layer forming process disclosed in the embodiment of the present invention is just a preferable example for the purpose of illustrations only, not intended to limit the scope of the invention, so it should be understood that other equivalents and modifications could be made thereto without departing from the spirit and scope of the invention.

Figure 3:
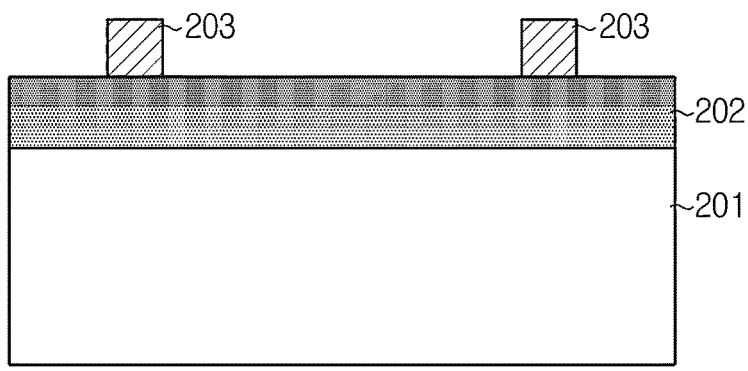

After the emitter layer 202 is formed through the above-mentioned process, an etching mask pattern 203 is formed through screen printing at a front electrode (205 of FIG. 7) connection area on the emitter layer 202 doped with an n-type impurity as shown in FIG. 3. Specifically, a mask (not shown) for printing is placed on the emitter layer 202. Here, the mask for printing has an opening pattern at a corresponding portion to an area where the etching mask pattern 203 will be formed. Next, the opening pattern is filled up by squeezing a paste for forming the etching mask pattern into the opening pattern while moving a screen printer (not shown) in a predetermined direction. Then, the mask for printing is removed from the emitter layer 202 to form the etching mask pattern 203 on the emitter layer 202. However, the present invention is not limited to a specific screen printing technique in forming the etching mask pattern 203.

In the present invention, the paste for the etching mask pattern 203 may comprise inorganic powder, an organic solvent and a binder. In the paste for forming the etching mask pattern according to the present invention, the inorganic powder has a tap density of 0.01 to 20 g/$cm^3$.

If the inorganic powder in the paste does not have a uniform particle shape, porosity between particles is high and permeation of an etchant is easy in a subsequent etching process, and consequently, detachment of a mask pattern proceeds relatively earlier. Accordingly, the paste of the present invention uses inorganic powder having uniform particle shape, and thus, has high resistance against an etchant. As a result, it takes a relatively long time to start the detachment of an etching mask pattern, and an emitter is stably formed. In the present invention, uniformity of power particle shape is indicated as a certain tap density value.

Preferably, a tap density of the inorganic powder used in the paste of the present invention is 0.01 to 20 g/$cm^3$. If the tap density is less than 0.01 g/$cm^3$, it is very difficult for the inorganic powder to be uniformly mixed in a paste, and consequently, printability and etching capability of the paste reduces. If the tap density exceeds 20 g/$cm^3$, the inorganic powder occupies a small volume in the entire paste, and its function as an etching mask reduces.

Preferably, the inorganic powder according to the present invention includes metal or metal oxide powder, or mixtures thereof. And, the inorganic powder according to the present invention may be glass frit type or non-glass frit type powder, or mixtures thereof.

Optionally, non-glass frit type powder is preferable. Typically, glass frit type powder is produced by melting metal or metal oxide through thermal treatment and cooling and pulverizing it. Because a pulverizing process is added in producing glass frit type powder, glass frit type powder has difficulty in generating fine particles and exhibits lower uniformity of particle shape, compared with non-glass frit type powder. Non-glass frit type powder can generate fine particles without an additional pulverizing process, and has uniform particle shape and relatively lower porosity.

The inorganic powder included in the paste for forming the etching mask pattern 203 of the present invention may be metal or metal oxide such as Si, Ti, ITO, $SiO_2$, $TiO_2$, $Bi_2O_3$, PbO and so on, or mixtures thereof, however the present invention is limited in this regard.

The metal or metal oxide powder according to the present invention has an average particle diameter of 1 nm to 10 μm, preferably, 10 nm to 5 μm, more preferably, 20 nm to 3 μm. A smaller average particle diameter can defer the detachment start time. Selectively, in the case that the inorganic powder according to the present invention is non-glass frit type powder, it is possible to generate fine particles of several nano to several tens of nano size level.

The content of the inorganic powder used to obtain the desired effects of the present invention may depend on the apparent specific gravity. For example, the inorganic powder may be included at an amount of 0.1 to 80 weight % based on the total weight of the paste.

The paste of the present invention comprises a binder to support a predetermined pattern and improve printability, and the binder may include an organic solvent and a binder resin. The binder resin may include ethyl cellulose, acrylate-based resin, epoxy resin, urethane resin, polystyrene, polypropylene and so on. Preferably, the binder resin has a molecular weight (Mw) of 5,000 to 1,000,000.

In the paste of the present invention, the organic solvent uniformly dissolves and/or disperses each component of the paste. The organic solvent may be an alcohol-based solvent such as terpineol, butyl carbitol or butyl carbitol acetate, texanol and so on, or mixtures thereof, however the present invention is not limited in this regard.

In the present invention, the content of the binder (including a binder resin and an organic solvent) may be 20 to 99.9 weight % based on the total weight of the paste, depending on the content of the inorganic powder. Here, the content of the binder resin may be properly selected according to various conditions. For example, the content of the binder resin may be 5 to 50 weight % based on the total weight of the binder, however the present invention is not limited in this regard. If the content of the binder resin is less than 5 weight %, the paste has an excessively low viscosity and consequently high flowability. If the content of the binder resin exceeds 50 weight %, the resin may be not completely dissolved in the solvent depending on the molecular weight, or even though the rein is dissolved in the solvent, the paste has high viscosity itself and consequently poor flowability.

Optionally, in the paste of the present invention, the metal or metal oxide powder may be coated with an organic silane compound, silicone oil or fatty acid that has a hydrophobic group, or a similar organic compound thereto so as to prolong the detachment start time of the mask pattern.

Optionally, in particle generation, a dispersant may be added to maintain dispersion stability of metal or metal oxide powder, for example, fatty acid-based, benzotriazole-based, hydroquinone-based and so on. Various kinds of dispersants may be used in consideration of stability with the binder used. And, it is obvious that the paste of the present invention may further comprise an additive used typically in the art, for example, a wetting agent, a thixotropic agent, a thickening agent and so on.

Figure 4:
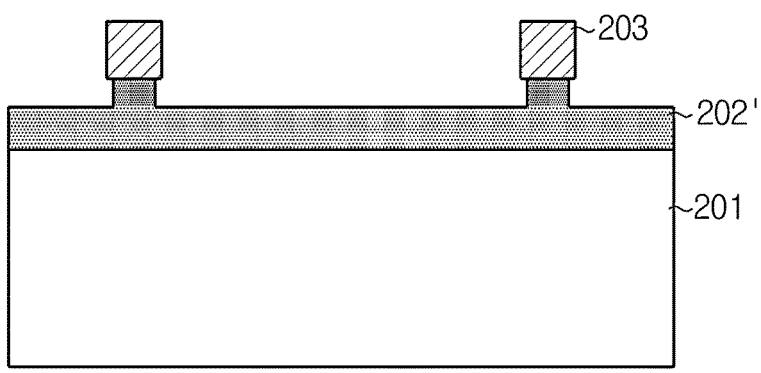

After the etching mask pattern 203 is formed, a selective emitter layer 202' is formed by etching back the emitter layer 202 using the etching mask pattern 203 on the emitter layer 202 as a mask as shown in FIG. 4. In the etch-back process of the emitter layer 202, only an upper portion of the emitter layer 202, that is not covered with the etching mask pattern 203, is etched at a predetermined depth. Thus, in the emitter layer 202 doped with a high concentration of impurity, only an area on which a solar light is incident can be selectively removed. The selective emitter layer 202' is doped with a high concentration of n-type impurity only at an area where a front electrode 205 is connected. As a result, the front electrode 205 can have the improved contact characteristics, thereby forming an ohmic contact. And, the life of carriers reduces, and consequently, it prevents reduction in efficiency of a solar cell.

In the etch-back process of the emitter layer 202, both a wet etchant and a dry etchant may be used. It is preferable to use a selective wet etchant so as to ensure stability and reproducibility of the etch-back process. For example, in the present invention, the emitter layer 202 is etched back by use of a selective wet etchant in which $HNO_3$, HF, $CH_3COOH$ and $H_2O$ are mixed at a volume ratio of 10:0.1~0.01:1~3: 5~10. As the concentration of impurity implanted into the emitter layer 202 is higher, the selective wet etchant exhibits a faster etch rate. That is, the selective wet etchant exhibits an etch rate of 0.08 to 0.12 μm/sec for an area doped with a high concentration of impurity, and an etch rate of 0.01 to 0.03 μm/sec for an area doped with a low concentration of impurity. Thus, if the selective wet etchant is used to an etch-back process, an uppermost portion of the emitter layer 202 doped with a high concentration of n-type impurity is selectively removed at the initial stage of the etching process, thereby ensuring stability and reproducibility of the etch-back process. Meanwhile, it is obvious that an etch rate of a selective wet etchant may vary depending on a volume ratio of an etch solution composition, kind and concentration of the diffused impurity and so on. Alternatively, an alkaline wet etchant such as KOH or a dry etchant such as $CF_4$ plasma may be used in the etch-back process of the emitter layer 202, which is obvious to an ordinary person skilled in the art.

Figure 5:
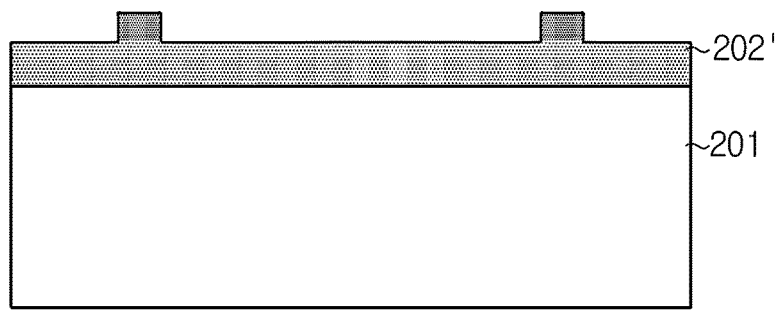
Figure 6:
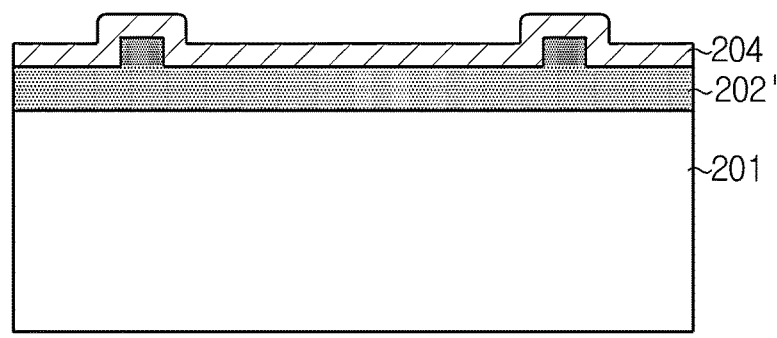

After the etch-back of the emitter layer 202 finishes, the selective emitter layer 202' is completely formed by removing the remaining etching mask pattern 203 as shown in FIG. 5. Then, as shown in FIG. 6, an anti-reflection film 204 is formed on the selective emitter layer 202'. The anti-reflection film 204 may have a single film structure of any one selected from the group consisting of a silicon nitride film, a silicon nitride film containing hydrogen, a silicon oxide film, a silicon oxide nitride film, $MgF_2$, ZnS, $MgF_2$, $TiO_2$ and $CeO_2$, or a multiple film structure of at least two material films. The anti-reflection film 204 is formed by vacuum deposition, chemical vapor deposition, spin coating, screen printing or spray coating. However, the present invention is not limited to specific structure and forming method of the anti-reflection film 204.

Figure 7:
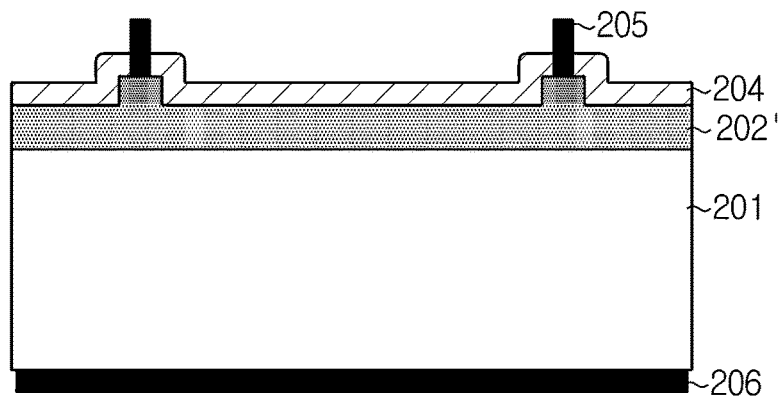

After the anti-reflection film 204 is formed, a front electrode 205 and a rear electrode 206 are connected with the surface of the selective emitter layer 202' and the rear surface of the substrate 201, respectively, as shown in FIG. 7. The front electrode 205 and the rear electrode 206 can be manufactured by well-known techniques, however may be preferably manufactured through screen printing. That is, the front electrode 205 is manufactured by screen printing a paste for manufacturing a front electrode, comprising silver (Ag), glass frit, a binder and so on, and thermally treating the paste. During the thermal treatment, the front electrode 205 penetrates through the anti-reflection film 204 due to a punch-through phenomenon, and is connected with the selective emitter layer 202'.

Similarly, the rear electrode 206 is manufactured by printing, on the rear surface of the substrate 201, a paste for manufacturing a rear electrode, comprising aluminum, quartz silica, a binder and so on, and thermally treating the paste. In the thermal treatment of the rear electrode, aluminum that is one of the components for manufacturing the rear electrode, diffuses through the rear surface of the substrate 201, so that a back surface field (not shown) layer may be formed at an interface between the rear electrode 206 and the substrate 201. The back surface field layer prevents carriers' movement to the rear surface of the substrate 201 and recombination. Prevention of carrier recombination results in increased open-circuit voltage and fill factor, and consequently improved conversion efficiency of a solar cell.

The present invention is not limited to a specific process for manufacturing the front electrode 205 and the rear electrode 206. For example, the front electrode 205 and the rear electrode 206 may be manufactured by typical photolithography and metal deposition other than screen printing.

Hereinafter, the present invention will be described in detail through specific examples. However, the description proposed herein is just a preferable example for the purpose of illustrations only, not intended to limit the scope of the invention, so it should be understood that the examples are provided for a more definite explanation to an ordinary person skilled in the art.

Examples 1 to 5

Each non-glass frit type paste for forming an etching mask pattern was prepared according to composition shown in the following table 1. A binder was obtained by adding ethyl cellulose (EC) to a solvent of butyl carbitol (BC) and terpineol (T) at a mixing ratio of 4:1, and heating and mixing them.

TABLE 1

| | Inorganic powder | | | Binder (weight %) | | Additive (weight %) |
|---|---|---|---|---|---|---|
| | Type (weight %) | Average particle diameter | Tap density (g/cm$^3$) | Resin (weight % in binder) | Organic solvent (weight % in binder) | Stearic acid(1) |
| Example 1 | SiO$_2$(33) | 3 μm | 1.1 | EC(20) | (66) BC/T(80) | Stearic acid(1) |
| Example 2 | Silane-coated SiO$_2$(33) | 3 μm | 0.8 | EC(20) | (66) BC/T(80) | Stearic acid(1) |
| Example 3 | Silane-coated SiO$_2$(33) | 1 μm | 0.5 | EC(20) | (66) BC/T(80) | Stearic acid(1) |
| Example 4 | SiO$_2$(10) | 50 nm | 0.2 | EC(20) | (89) BC/T(80) | Stearic acid(1) |
| Example 5 | SiO$_2$(10) | 20 nm | 0.1 | EC(20) | (89) BC/T(80) | Stearic acid(1) |

Experimental Example: Measurement of Detachment Start Time

Figure 9:
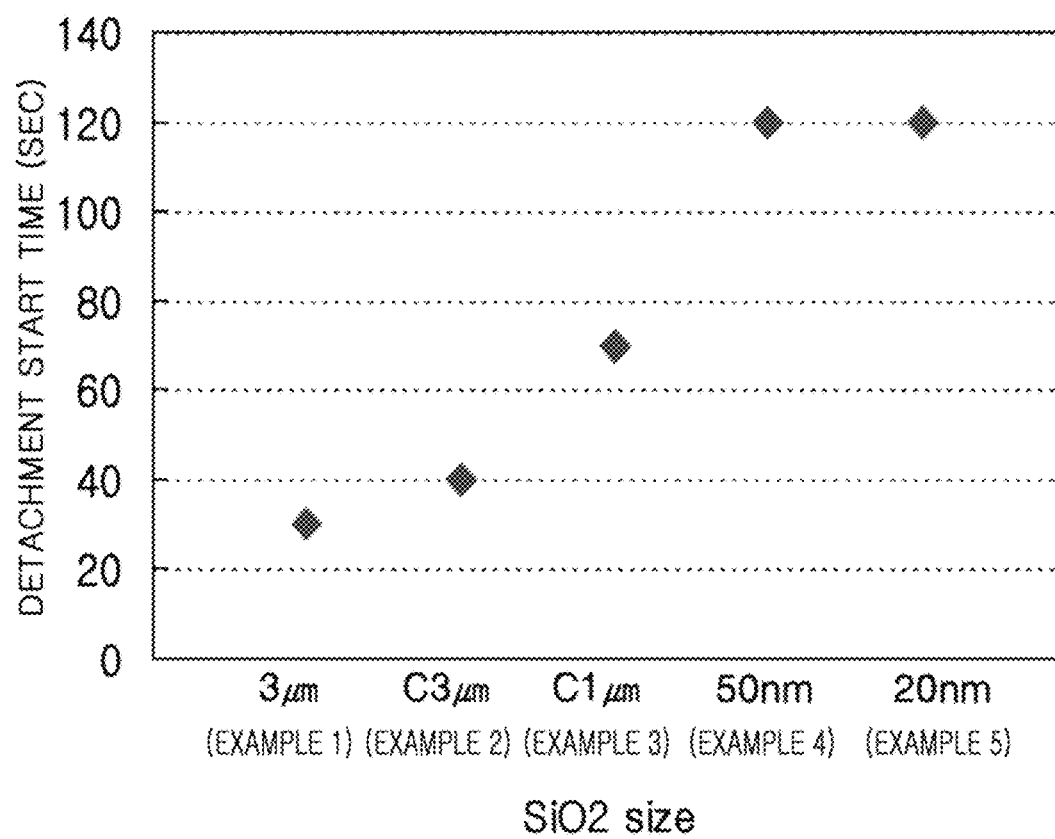
FIG. 9 is a graph illustrating the detachment start time of an etching mask patterns formed using each paste prepared according to examples 1 to 5 of the present invention.

The experiment was carried out to measure the detachment start time in an etch-back process of an etching mask pattern formed using each paste of examples 1 to 5, and the measurement results are shown in FIG. 9. The experiment was made such that each paste of examples was printed on a silicon wafer doped with phosphorous (P), dried at 150° C., dipped into a selective wet etchant, in which HNO$_3$, HF, CH$_3$COOH and H$_2$O were mixed at a volume ratio of 10:0.1~0.01:1~3:5~10, for 120 seconds, and then the detachment time initiated by the etchant was measured.

As shown in FIG. 9, it is found that a paste made from metal or metal oxide according to the present invention has the prolonged detachment start time, and that the smaller the average particle diameter is, the more late the detachment start time is.

Experimental Example: Measurement of Electrical Characteristics of Selective Emitter The experiment was carried out to measure Voc (open-circuit voltage), Jsc (short-circuit current), FF (fill factor) and Eff (efficiency) of a selective emitter formed after dipping an etching mask pattern formed using each paste of examples 3 to 5 into a wet etchant for 45 seconds, and the measurement results are shown in the following table 2.

TABLE 2

| | Voc(mV) | Jsc (mA/cm$^3$) | FF (%) | Eff (%) |
|---|---|---|---|---|
| Before etching | 0.615 | 32.6 | 76.4 | 15.3 |
| | 0.616 | 32.6 | 77.0 | 15.4 |
| Example 3 | 0.620 | 33.3 | 75.7 | 15.6 |
| | 0.621 | 33.3 | 76.3 | 15.8 |
| Example 4 | 0.619 | 33.4 | 74.9 | 15.5 |
| | 0.621 | 33.3 | 76.4 | 15.8 |
| Example 5 | 0.620 | 33.1 | 75.1 | 15.4 |
| | 0.621 | 33.3 | 76.4 | 15.8 |

What is claimed is:

1. A method for manufacturing a solar cell, comprising:
    (a) preparing a silicon semiconductor substrate doped with a first conductive impurity;
    (b) forming an emitter layer on the substrate by doping an upper portion of the substrate with a second conductive impurity having the opposite polarity to the first conductive impurity;
    (c) forming an etching mask pattern at a front electrode connection area on the emitter layer using a paste comprising inorganic powder, an organic solvent and a binder;
    (d) etching back the emitter layer by using the etching mask pattern as a mask;
    (e) removing the etching mask pattern remaining after the etch-back;
    (f) forming an anti-reflection film over a front surface of the substrate;
    (g) establishing a connection between a front electrode and the front electrode connection area by penetrating through the anti-reflection film; and
    (h) establishing a connection between a rear electrode and a rear surface of the substrate,
    wherein the inorganic powder consists of the inorganic powder having a tap density of 0.01 to 20 g/cm$^3$ and an average particle diameter of 1 nm to 50 nm.

2. The method for manufacturing a solar cell according to claim 1,
    wherein the binder includes an organic solvent and a binder resin.

3. The method for manufacturing a solar cell according to claim 1,
    wherein the first conductive impurity is a p-type impurity and the second conductive impurity is an n-type impurity.

4. The method for manufacturing a solar cell according to claim 1,
    wherein the inorganic powder includes metal or metal oxide powder, or mixtures thereof.

5. The method for manufacturing a solar cell according to claim 1,
    wherein the inorganic powder of step (c) includes any one metal or metal oxide powder selected from the group consisting of Si, Ti, ITO, SiO$_2$, TiO$_2$, Bi$_2$O$_3$ and PbO, or mixtures thereof.

6. The method for manufacturing a solar cell according to claim 1,
    wherein the inorganic powder is coated with silane compound, silicon oil or fatty acid.

7. The method for manufacturing a solar cell according to claim 1,
   wherein, in the step (d), the emitter layer is etched back using a selective wet etchant in which $HNO_3$, HF, $CH_3COOH$ and $H_2O$ are mixed at a volume ratio of 10:0.1~0.01:1~3:5~10.

8. The method for manufacturing a solar cell according to claim 7,
   wherein the selective wet etchant has an etch rate of 0.08 to 0.12 μm/sec for an area doped with a high concentration of impurity in the emitter layer and an etch rate of 0.01 to 0.03 μm/sec for an area doped with a low concentration of impurity in the emitter layer.

9. The method for manufacturing a solar cell according to claim 1,
   wherein, in the step (d), the emitter layer is etched back using an alkaline wet etchant or a plasma dry etchant.

10. The method for manufacturing a solar cell according to claim 7, wherein the paste comprises 0.1 to 80 wt. % inorganic powder.

11. The method for manufacturing a solar cell according to claim 2, wherein the paste comprises 5 to 50 wt. % of the binder resin.

12. The method for manufacturing a solar cell according to claim 11, wherein the binder resin has a molecular weight of 5,000 to 1,000,000.

13. The method for manufacturing a solar cell according to claim 12, wherein the binder resin comprises ethyl cellulose, acrylate-base resin, epoxy resin, urethane resin polystyrene or polypropylene.

\* \* \* \* \*